(12) United States Patent
Tsai et al.

(10) Patent No.: US 12,279,509 B2
(45) Date of Patent: Apr. 15, 2025

(54) LIGHT EMITTING DEVICE WITH OPTIMIZED LIGHT-GUIDING UNITS

(71) Applicant: InnoLux Corporation, Miao-Li County (TW)

(72) Inventors: Tsung-Han Tsai, Miao-Li County (TW); Hsiao-Lang Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/657,712

(22) Filed: May 7, 2024

(65) Prior Publication Data

US 2024/0292721 A1    Aug. 29, 2024

Related U.S. Application Data

(63) Continuation of application No. 18/108,022, filed on Feb. 10, 2023, now Pat. No. 12,010,898.

(30) Foreign Application Priority Data

Mar. 21, 2022   (CN) ......................... 202210279850.4

(51) Int. Cl.
*H10K 59/80* (2023.01)
*H10K 59/38* (2023.01)

(52) U.S. Cl.
CPC .......... *H10K 59/879* (2023.02); *H10K 59/38* (2023.02)

(58) Field of Classification Search
CPC ......... G09G 2300/0465; H10K 59/352; H10K 59/879; H10K 59/38; H10K 50/858
See application file for complete search history.

(56) References Cited

U.S. PATENT DOCUMENTS

2021/0183963 A1*   6/2021   Jang ..................... H10K 59/353

FOREIGN PATENT DOCUMENTS

| CN | 107863448 A | * | 3/2018 | .......... G02B 3/0043 |
| JP | 2015128027 A | * | 7/2015 | |

* cited by examiner

*Primary Examiner* — Mariceli Santiago
(74) *Attorney, Agent, or Firm* — Winston Hsu

(57) ABSTRACT

A light emitting device has a light emitting panel and a light guiding structure. The light emitting panel has a pixel, and the pixel has a first sub-pixel and a second sub-pixel. An area of the first sub-pixel is greater than an area of the second sub-pixel. The light guiding structure is set on the light emitting panel and has a first amount of light guiding units overlapping with the first sub-pixel and a second amount of light guiding units overlapping with the second sub-pixel. The first amount is greater than the second amount.

5 Claims, 17 Drawing Sheets

| Structure of the light-guiding unit | Shape of the light-guiding unit | | | |
|---|---|---|---|---|
| Curved | ○ | ⬭ | | |
| Polygonal | ⬡ | ⬠ | ▢ | ▭ | ⬢ | ◇ |
| Curved + Polygonal | ▢ | ▭ | | |

FIG. 4A

LIGHT EMITTING DEVICE WITH OPTIMIZED LIGHT-GUIDING UNITS

CROSS REFERENCE TO RELATED APPLICATIONS

This application is a continuation application of U.S. Application Ser. No. 18/108,022, filed on Feb. 10, 2023. The content of the application is incorporated herein by reference.

BACKGROUND OF THE DISCLOSURE

1. Field of the Disclosure

The present disclosure relates to a light emitting device, and in particular to a light emitting device with optimized number of light-guiding units.

2. Description of the Prior Art

In a general light emitting device, the light emitted from the light source is guided through a lens structure to reduce the driving current of the light source and save energy. However, the prior art does not teach how many lenses should be used to effectively guide the light.

SUMMARY OF THE DISCLOSURE

According embodiments, the present disclosure discloses a light emitting device comprising a light emitting panel and a light guiding structure. The light emitting panel comprises a pixel, and the pixel comprises a first sub-pixel and a second sub-pixel. In a top view of the light emitting device, an area of the first sub-pixel is greater than an area of the second sub-pixel. The light guiding structure is disposed on the light emitting panel and comprises a first amount of light guiding units overlapping with the first sub-pixel and a second amount of light guiding units overlapping with the second sub-pixel. The first amount is greater than the second amount.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 4A is used to illustrate several possible shapes of the light-guiding units according to different embodiments of the present disclosure.

DETAILED DESCRIPTION

Figure 1:
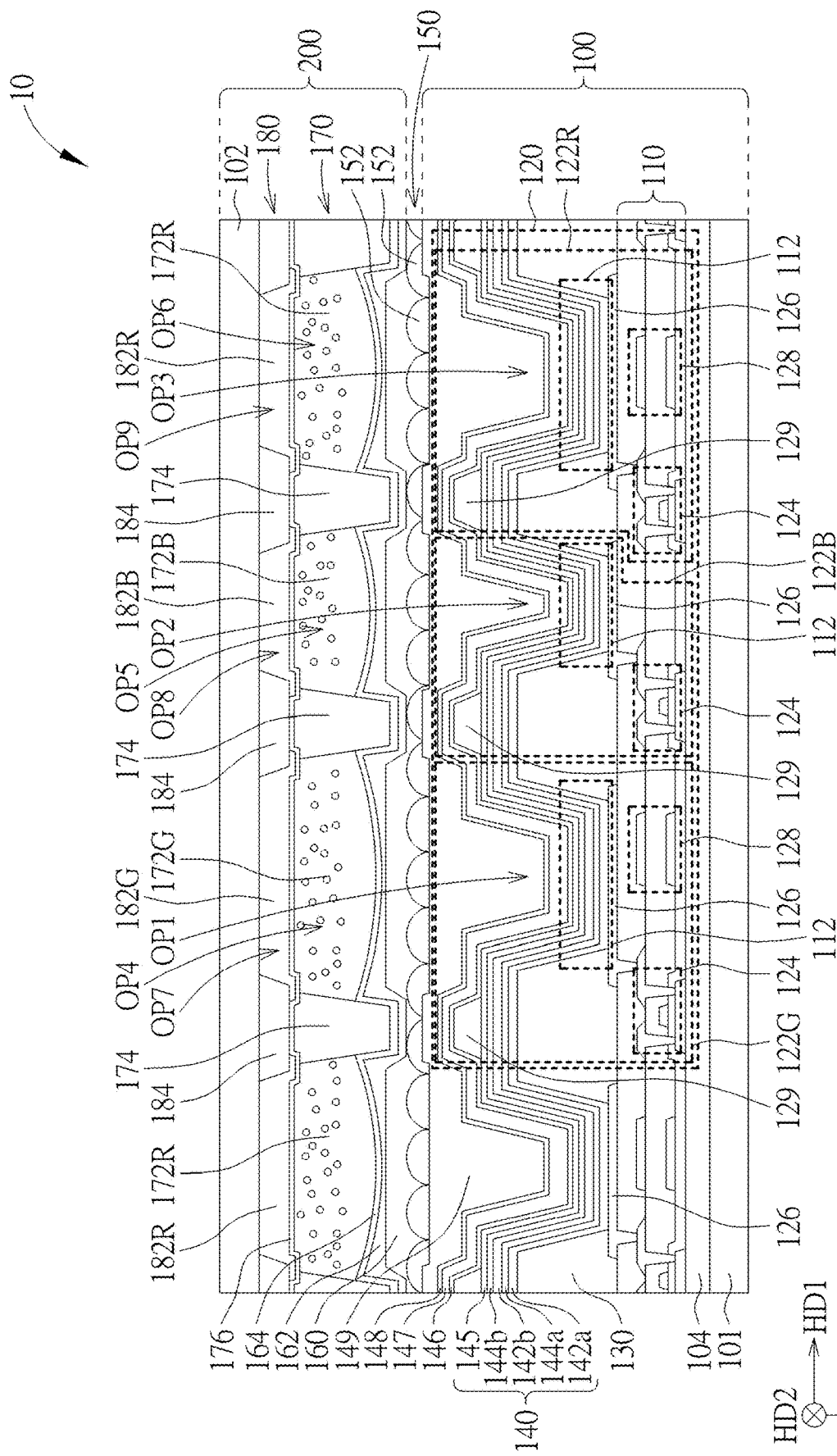
FIG. 1 is a schematic cross-sectional view of the light emitting device according to an embodiment of the present disclosure.

The present disclosure may be understood by reference to the following detailed description, taken in conjunction with the drawings as described below, and for purposes of illustrative clarity and being easily understood by the readers, various drawings of this disclosure may be simplified, and the elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "comprise", "include" and "have" are used in an open-ended fashion, and thus should be interpreted to mean "include, but not limited to.". When the terms "contains," "includes," and/or "has" are used in this specification, they designate the presence of said feature, area, step, operation, and/or component, but do not preclude the presence or addition of one or more other features, areas, steps, operations, components, and/or combinations thereof.

The direction terms used in the following embodiments such as up, down, left, right, in front of or behind are only the directions referring to the attached figures. Thus, the direction terms used in the present disclosure are for illustration, and are not intended to limit the scope of the present disclosure. It should be noted that the elements which are specifically described or labeled may exist in various forms for those skilled in the art. Besides, when a layer is referred to as being "on" another element or layer, or is referred to as being "connected" to another element or layer, it may be directly on or connected to the other element or layer, or intervening layers or elements may be included between the layer and the other element or layer (indirectly). In contrast, when an element or layer is referred to as being "directly on" or "directly connected to" another element or layer, there are no intervening elements or layers present. Alternatively, when an element is referred to as being "coupled to another element (or a variation t thereof)" or "electrically connected to another element (or a variation thereof), it may be directly connected to the other element, or indirectly connected to this other component through one or more components.

The directional terms mentioned in this document, such as "upper", "lower", "front", "rear", "left", "right", etc., are only referring to the directions of the drawings. Accordingly, the directional terms used are for illustration, not for limitation of the present disclosure. In the drawings, each figure illustrates the general features of structure and/or materials used in a particular embodiment. However, these drawings should not be interpreted as defining or limiting the scope or nature encompassed by these embodiments. For example, the relative sizes, thicknesses and positions of layers, regions and/or structures may be reduced or exaggerated for clarity.

The ordinal numbers used in the specification and claims, such as "first", "second", etc., are used to modify elements, which do not imply and represent that the element(s) has any previous order, nor does it represent the order of a component and another component, or the order of the manufacturing method, the use of the order is only used to enable a named component and another component with the same name can be made clear distinction. The same terminology may not be used in the claims and the specification, whereby the first component in the specification may be the second component in the claims.

The terms "about", "equal to", "equivalent", "the same", "roughly" or "substantially" generally mean within 20% of a given value or range, or mean within 10%, 5%, 3%, 2%, 1%, or 0.5% of a given value or range.

It should be understood that the embodiments set forth below may be substituted, recombined, or mixed to complete other embodiments without departing from the spirit of the present disclosure. The features of each embodiment may be mixed and matched as long as they do not contradict the spirit of the invention or conflict with each other.

In the present disclosure, the length, width, thickness, height, or area, or the distance or spacing between components may be measured by optical microscopy (OM), scanning electron microscope (SEM), thin film thickness profilometer ($\alpha$-step), ellipsometer, or other suitable means. In detail, according to some embodiments, a scanning electron microscope may be used to obtain a profile structure image of the component to be measured, and to measure the width, thickness, height, or area of each component, or the distance or spacing between the components, but not limited to. In addition, any two values or directions used for comparison may have certain errors.

Unless otherwise defined, all terms (including technical and scientific terms) used herein have the same meaning as commonly understood by one of ordinary skill in the art to which this disclosure belongs. It can be understood that these terms, such as defined terms in commonly used dictionaries, should be interpreted as having meanings consistent with the background or context of the related technology and the present disclosure, and should not be interpreted in an idealized or overly formal manner, unless there are special definitions in the disclosed embodiments.

The light emitting device of the present disclosure may optionally include light sensing, image sensing, touch control, antenna, other suitable functions or a combination of the above functions, but is not limited thereto. The light emitting device can be a bendable, flexible or stretchable light emitting device. In some embodiments, the light emitting device may comprise a splicing device, but is not limited thereto. The light emitting device may for example include liquid crystal molecule (LC molecule), light-emitting diode (LED), quantum dot (QD), fluorescence, phosphor, other suitable materials or combinations thereof, but not limited thereto. For instance, the LED may comprise organic light-emitting diodes (OLEDs) or inorganic light-emitting diodes. The inorganic light-emitting diodes may be, for example, micro-LEDs, submillimeter light-emitting diodes (mini-LEDs), quantum dot light-emitting diodes (QLEDs or QDLEDs), nanowire light-emitting diodes (nanowire LEDs), bar type light-emitting diodes (bar type LEDs), nanorod light-emitting diodes (nanorod LEDs) or other suitable light-emitting elements, but not limited thereto. In addition, the light emitting device may be, for example, a color display device, a monochrome display device or a grayscale display device. The shape of the light emitting device may be, for example, rectangular, circular, polygonal, a shape with curved edges, curved or other suitable shapes. The light emitting device can optionally have peripheral systems such as a drive system, a control system, a light source system, a shelf system, etc. The light emitting device below is described by taking a display device as an example, but not limited thereto.

Referring to FIG. 1, FIG. 1 is a schematic cross-sectional view of the light emitting device 10 according to an embodiment of the present disclosure. In order to clearly show the main features of the present disclosure, the drawings herein show a cross-sectional view of a part of the light emitting device. As shown in FIG. 1, the light emitting device 10 comprises a light emitting panel 100 and a light guiding structure 150. The light emitting panel 100 comprises at least a pixel 120, and the pixel 120 may comprise sub-pixel 122G, sub-pixel 122B, and sub-pixel 122R, but this disclosure is not limited to thereto. The light emitting panel 100 may comprise a substrate 101, a circuit layer 110, a pixel defining layer (PDL) 130, and a light-emitting structure layer 140, wherein the pixels 120 are formed by the circuit layer 110, the pixel defining layer 130, and the light-emitting structure layer 140. Each of the sub-pixel 122G, sub-pixel 122B, and sub-pixel 122R comprises a light-emitting unit 112 and an active element 124. The active element 124 is used to drive the corresponding light-emitting unit 112 to emit light. At least one of sub-pixels 122G, sub-pixels 122B, and sub-pixels 122R may also contain a capacitor 128, and one end of the capacitor 128 is coupled to one end of the corresponding light-emitting unit 112.

The light guiding structure 150 is set on the light emitting panel 100 and comprises a plurality of light-guiding units 152, which are used to guide light emitted from the light emitting panel 100. In this embodiment, the light-guiding units 152 can be microlenses or liquid crystal lenses, but the present disclosure is not limited thereto. The material of the light-guiding unit 152 may comprise, for example, silicon, silicon oxide (SiOx), silicon nitride (SiNx), zirconium oxide (ZrO), polymer, acrylate, monomer, photo-initiator, acrylic, poly methyl methacrylate (PMMA), polyvinyl chloride (PVC), other suitable materials or a combination of the above, but not limited thereto. The light-guiding unit 152 is formed on the light emitting panel 100 by first forming a cured layer on the light-guiding panel 100, and then patterning the cured layer, such as dry etching, to form the light-guiding unit 152. In another embodiment, the cured layer can be patterned on the light-guiding panel 100 by exposure and wet etching first, and then heat melting is performed to form the light-guiding unit 152. In another embodiment, the light-guiding unit 152 can first be modeled in a mask mold formed by, for example, polydimethylsiloxane (PDMS), so as to obtain a formed transfer structure, which is then pasted on the light emitting panel 100. The mask mold would be removed to form the light-guiding unit 152 on the light emitting panel 100. In another embodiment, the light guide structure 150 can be bonded on the light emitting panel 100 with an adhesive layer or a film layer.

The substrate 101 of the light emitting panel 100 may, for example, contain a flexible substrate or a rigid substrate. The material of substrate 101 may, for example, comprise glass, ceramic, quartz, sapphire, acrylic, polyimide (PI), polyethylene terephthalate (PET), polycarbonate (PC), other suitable materials or a combination of the above, but not limited to.

The circuit layer 110 of the light emitting panel 100 is set between the light-emitting structure layer 140 and the substrate 101 for transmitting signals for controlling sub-pixels 122G, sub-pixels 122B and sub-pixels 122R. The active elements 124 and capacitors 128 are formed in the circuit layer 110. The circuit layer 110 can also contain a plurality of electrodes 126, which can be set to correspond to the opening OP1, opening OP2 and opening OP3 of the pixel defining layer 130 to become the electrodes of the light-emitting units 112. The direction TD is the top view direction of the substrate 101. In some embodiments, the light-emitting unit 112 may also contain a hole transmission layer (HTL), a hole injection layer (HIL), an electron transmission layer (ETL), an electron injection layer (EIL), and a charge generation layer (CGL), which are set on the electrode 126, but not limited to this. In some embodiments, the light-emitting unit 112 can be adapted according to requirements, such as containing a plurality of organic light-emitting diodes or having different structures.

The light-emitting structure layer 140 may, for example, comprise a stack of organic light-emitting layer 142a, inorganic material layer 144a, organic light-emitting layer 142b, inorganic material layer 144b, and electrode layer 145. The stacked structure of the light-emitting structure layer 140 is not limited to that shown in FIG. 1, and may contain at least a stack of organic light-emitting layer 142a, inorganic material layer 144a, and electrode layer 145. Each electrode 126 and organic light-emitting layer 142a, inorganic material layer 144a, organic light-emitting layer 142b, inorganic material layer 144b and electrode layer 145 located on the part thereof may form an organic light-emitting diode (i.e., one of the light-emitting units 112). Although in the embodiment, the light-emitting unit 112 is an organic light-emitting diode, the disclosure is not limited thereto. The light unit 112 may also be other light-emitting elements, such as inorganic light-emitting diodes or other suitable light-emitting elements.

In some embodiments, the light emitting panel 100 may also optionally comprise a buffer layer 104 disposed between the substrate 101 and the circuit layer 110. The buffer layer 104 may be used, for example, to block water, oxygen or ions from entering the light emitting device 10. The buffer layer 104 may be single or multiple layers, and the material of the buffer layer 104 may contain, for example, silicon nitride, silicon oxide, silicon oxynitride, aluminum oxide, resin, other suitable materials, or a combination of the above, but not limited thereto.

The light emitting panel 100 may also comprise an inorganic material layer 146, an organic material layer 147, an inorganic material layer 148, and/or a protective layer 149 stacked on the light-emitting structure layer 140 to reduce water or oxygen penetration. The inorganic material layer 146 and the inorganic material layer 148 may comprise s silicon nitride, silicon oxide, silicon oxynitride, aluminum oxide, other suitable protective material, or any combination of the above inorganic materials, but not limited thereto. The organic material layer 147 may comprise a resin, but is not limited thereto.

The light emitting panel 100 may also optionally contain auxiliary electrodes 129, which may be used to reduce the resistance difference between the electrode layer 145 of the light-emitting unit 112 and the external voltage source or surrounding circuitry. The auxiliary electrode 129 may be disposed between the electrode layer 145 and the inorganic material layer 146. The material of the auxiliary electrode 129 may comprise a magnesium-silver layer, nano-silver glue, aluminum, copper, or other suitable conductive material, but is not limited thereto. In some embodiments, the auxiliary electrode 129 and the electrode layer 145 may comprise the same material, but are not limited thereto.

The light emitting device 10 may also contain a light-emitting structure 200, and a light guiding structure 150 may be disposed between the light-emitting structure 200 and the light emitting panel 100. The light-emitting structure 200 may comprise a substrate 102, a filter structure 180, and/or a light conversion structure 170. The substrate 102 may comprise, for example, a flexible substrate or a rigid substrate. The material of the substrate 102 may be the same as or different from the material of the substrate 101.

The filter structure 180 is formed on one side of the substrate 102 and is disposed above the light guiding structure 150. The filter structure 180 comprises a filter unit 182G, a filter unit 182B, and a filter unit 182R. From the top view direction TD, the filter unit 182G overlaps with the sub-pixel 122G, the filter unit 182B overlaps with the sub-pixel 122B, and the filter unit 182R overlaps with the sub-pixel 122R. In this embodiment, the filter unit 182G may be a green filter unit, the filter unit 182B may be a blue filter unit, and the filter unit 182R may be a red filter unit. The layout area of the filter unit 182G may be larger than the layout area of the filter unit 182B and the layout area of the filter unit 182R, and the layout area of the filter unit 182R may be larger than the layout area of the filter unit 182B. In addition, the filter unit 182G, the filter unit 182B and the filter unit 182R are placed in the opening OP7, the opening OP8 and the opening OP9, respectively, around which a shading structure 184 is formed. The shading structure 184 may be a black matrix (BM) layer and the material may comprise black resin, but is not limited thereto.

The light conversion structure 170 is set between the filter structure 180 and the light guiding structure 150, and an insulating layer 176 may be set between the light conversion structure 170 and the filter structure 180. From the top view direction TD, the light conversion unit 172G overlaps with the filter unit 182G and the sub-pixel 122G, the light conversion unit 172B overlaps with the filter unit 182B and the sub-pixel 122B, and the light conversion unit 172R overlaps with the filter unit 182R and the sub-pixel 122R. The area of the light conversion unit 172G may be larger than the area of the light conversion unit 172B and the light conversion unit 172R, and the area of the light conversion unit 172R may be larger than the area of the light conversion unit 172B. In addition, the light conversion unit 172G, the light conversion unit 172B, and the light conversion unit 172R are set in the opening OP4, the opening OP5, and the opening OP6, respectively, with a shading structure 174 formed around them respectively. The shading structure 174 may be another black matrix layer. In some embodiments, the light conversion unit 172G, the light conversion unit 172B, and the light conversion unit 172R may comprise, for example, scattering particles, fluorescent materials, phosphorescent materials, quantum dot particles, or other light conversion materials that can convert the color of light. In some embodiments, the light conversion unit 172B may comprise scattering particles but not quantum dot particles, while the light conversion unit 172G and the light conversion unit 172R may comprise scattering particles and quantum dot particles. In addition, the light-emitting structure 200 may additionally include a sealing layer 160, an insulating layer 162, and a protective layer 164, but not limited thereto.

The light conversion structure 170 is set between the filter structure 180 and the light guiding structure 150, and an insulating layer 176 may be set between the light conversion structure 170 and the filter structure 180. The light conversion unit 172G overlaps with the filter unit 182G and sub-pixel 122G, the light conversion unit 172B overlaps with the filter unit 182B and sub-pixel 122B, and the light conversion unit 172R overlaps with the filter unit 182R and sub-pixel 122R. The area of the light conversion unit 172G may be larger than the area of the light conversion unit 172B and the light conversion unit 172R, and the area of the light conversion unit 172R may be larger than the area of the light conversion unit 172B. In addition, the light conversion unit 172G, the light conversion unit 172B, and the light conversion unit 172R are set in the opening OP4, the opening OP5, and the opening OP6 respectively, with a shading structure 174 formed around them respectively. The shading structure 174 may be another black matrix layer. In some embodiments, the light conversion unit 172G, the light conversion unit 172B, and the light conversion unit 172R may comprise, for example, scattering particles, fluorescent phosphorescent materials, quantum dot particles, or other light conversion materials that can convert the color of light. In some embodiments, the light conversion unit 172B may comprise scattering particles but not quantum dot particles, while the light conversion unit 172G and the light conversion unit 172R may comprise scattering particles and quantum dot particles. In addition, the light-emitting structure 200 may additionally include a sealing layer 160, an insulating layer 162, and a protective layer 164, but not limited thereto.

Figure 4B:
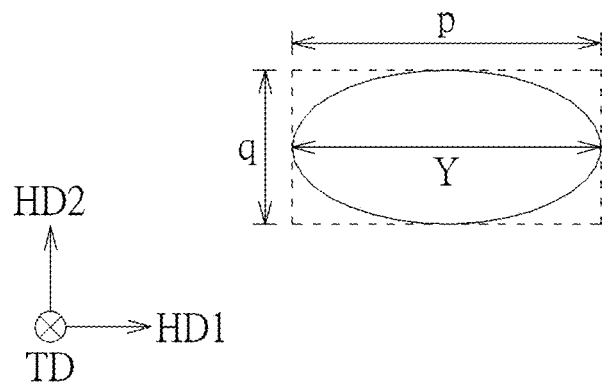
FIG. 4B to FIG. 4D are used to illustrate how the size of the light-guiding unit of the present disclosure are defined.
Figure 4C:
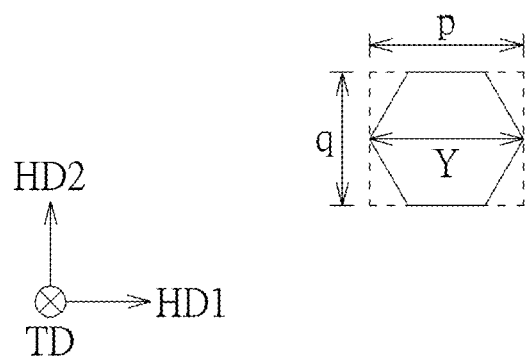
Figure 4D:
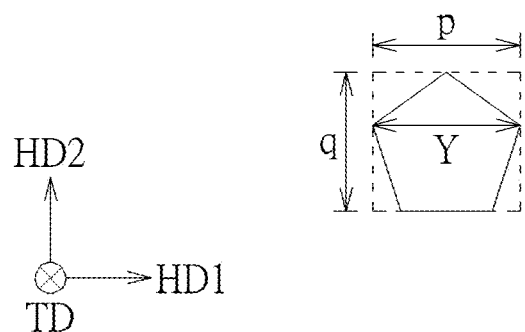

Please refer to FIG. 4A to FIG. 4D. FIG. 4A is used to illustrate several possible shapes of the light-guiding units 152 according to different embodiments of the present disclosure. FIG. 4B to FIG. 4D are used to illustrate how the size Y of the light-guiding unit 152 of the present disclosure are defined. As shown in FIG. 4A, from the top view direction TD, a bottom surface of the light-guiding unit 152 can be roughly divided into three major categories: "curved", "polygonal" and "curved+polygonal". The category "curved" may include, for example, round and elliptical. The category "polygonal" may include, for example, quadrilateral, pentagonal and hexagonal. The category "curved+polygonal" is mainly to round the corners of polygons. The shapes of the light-guiding unit 152 are only exemplary, and the shapes of the light-guiding units 152 of the present disclosure are not limited to the shapes shown in FIG. 4A. In addition, the size Y of the light-guiding unit 152 is defined by drawing a virtual rectangle tangent to the edge of the light-guiding unit 152 (shown as a dashed lines) along the direction HD1 and direction HD2, and the largest of the width p and length q of the drawn rectangle is defined as the size Y of the light-guiding unit 152. The size Y can range from 2 micrometers to 80 micrometers, but the present disclosure is not limited to this.

Figure 5A:
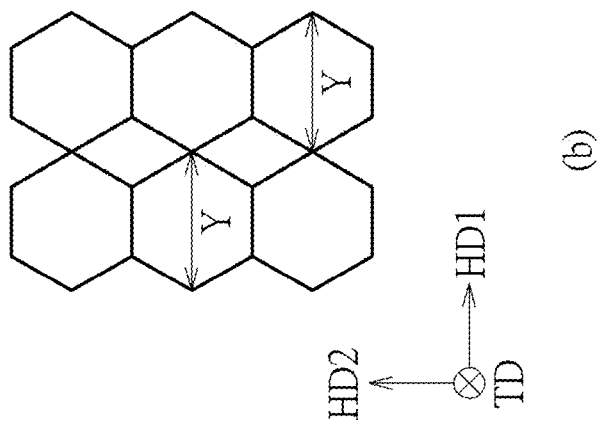
FIG. 5A and FIG. 5B are used to illustrate several arrangements of the light-guiding units of the present disclosure.
Figure 5A:
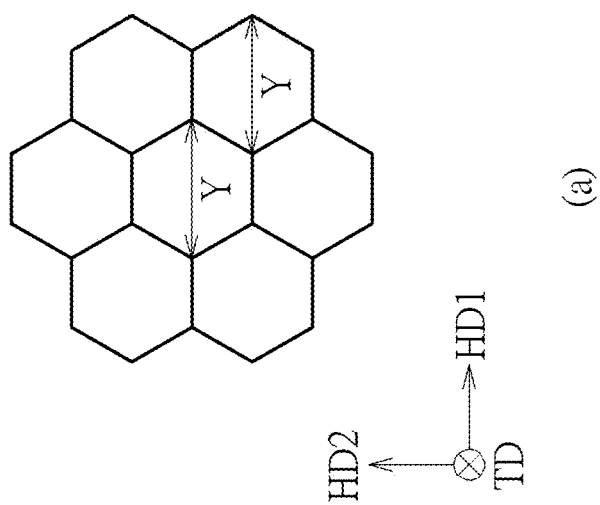
Figure 5B:
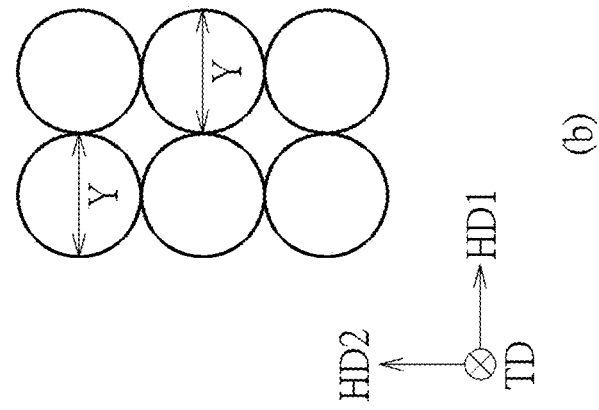
Figure 5B:
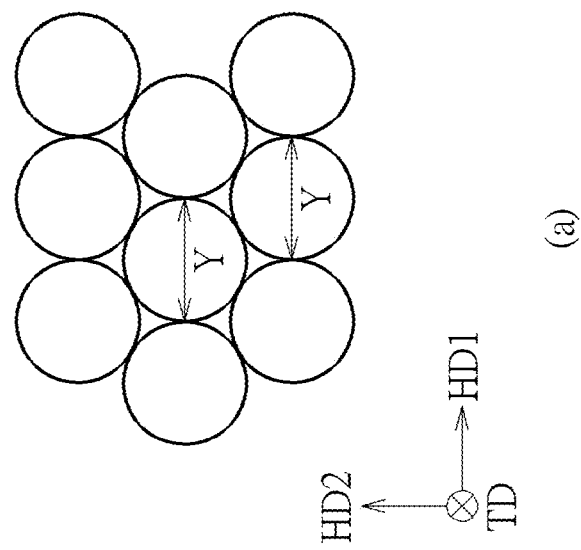

Referring to FIG. 5A and FIG. 5B, FIG. 5A and FIG. 5B are used to illustrate several arrangements of the light-guiding units 152 of the present disclosure. In particular, the shape of the light-guiding unit 152 illustrated in FIG. 5A is a square hexagon, and the shape of the light-guiding unit 152 illustrated in FIG. 5B is a circle. Furthermore, the light-guiding units 152 drawn in part (a) of FIG. 5A and FIG. 5B are arranged in a staggered and denser manner so that the gap between the light-guiding units 152 is minimized. The light-guiding units 152 drawn in part (b) of FIG. 5A and FIG. 5B are not arranged in the densest manner, for example, in a matrix arrangement. Therefore, the light-guiding units 152 drawn in part (b) have a larger gap between the light-guiding units 152 compared to the light-guiding units 152 drawn in part (a) in both FIG. 5A and FIG. 5B.

Figure 3:
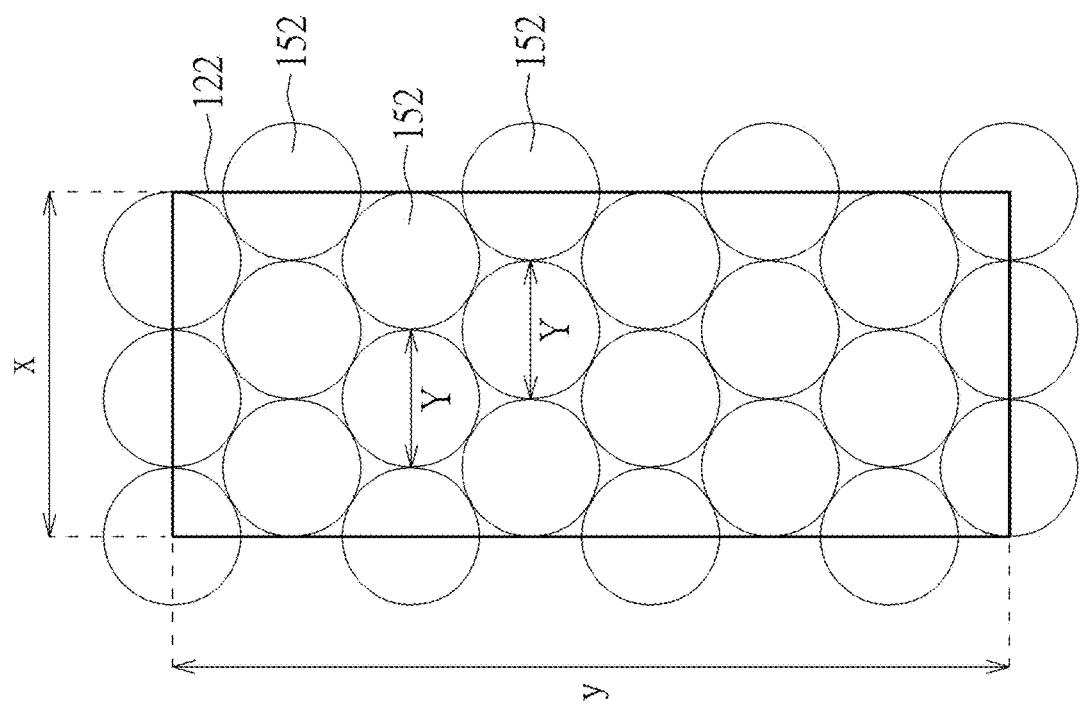
FIG. 3 is used to illustrate the relative positions and sizes between the light-guiding units and the sub-pixels of the pixel in FIG. 1.
Figure 3:
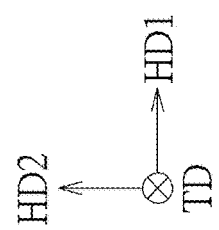

It will be further derived that when the shape of the light-guiding unit 152 of the light guiding structure 150 is circular, a number of partial light-guiding units 152 overlapping with the sub-pixels 122 of the pixels 120 in the direction TD of the light emitting device 10 is N, and the number N is an integer, then the number N satisfies the following equation.

$$N = m*n + \text{a complementary value}$$

where m is the number of light-guiding units 152 overlapping with a single sub-pixel 122 along direction HD1, n is the number of light-guiding units 152 overlapping with a single sub-pixel 122 along direction HD2, m*n denotes m multiplied by n, and the complementary value is the compensation for the number N. Taking FIG. 3 as an example, the shape of the light guiding structure 150 is circular, and m satisfies the following equation:

$$m = x/Y$$

n satisfies the following equation:

$$n = [(2y/Y) + (3\wedge 0.5) - 2]/(3\wedge 0.5)$$

Where (3^0.5) denotes the square root of 3.

In addition, since some light guide units 152 do not completely overlap with sub-pixels 122, the number N must be compensated by the complementary value. In detail, the complementary value can be obtained by dividing the total area of light-guiding units 152 that do not completely overlap with sub-pixels 122 by the area of a single light-guiding unit 152. For example, in FIG. 3, the compensation value can be 6.

Figure 2:
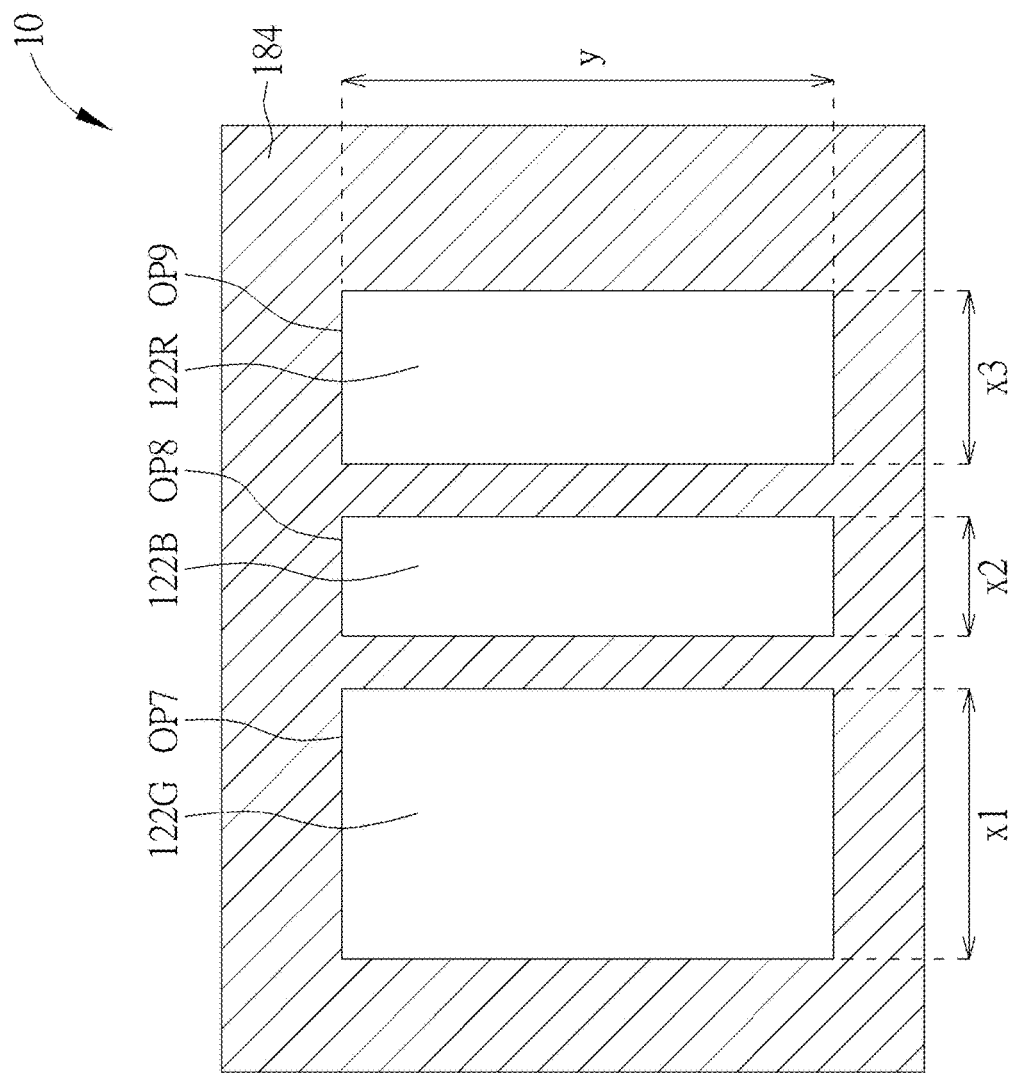
FIG. 2 shows a top view of the light emitting device of FIG. 1.
Figure 2:
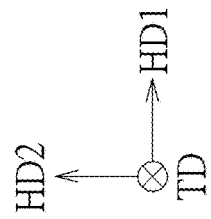

In addition, if the shape of the light-guiding units 152 is hexagonal and arranged in a staggered pattern, the above number N satisfies the following equation.

$$N = A/B + \text{a complementary value}$$

Where A is the area of a single sub-pixel 122, B is the area of a single light-guiding unit 152, and the complementary value may be 7. In some embodiments, the area of the sub-pixel 122 can be calculated based on the opening range of the pixel defining layer 130 in view from the direction TD, e.g., the bottom area of the openings of the pixel defining layer 130. In other embodiments, if there is no pixel defining layer, the area of the light-emitting surface of the light-emitting unit is used as the area of the sub-pixel 122. In other embodiments, such as shown in FIG. 2, the area of each opening (e.g., OP7, OP8 or OP9) of the shading structure 184 adjacent to the light-emitting surface of the light emitting device 10 may be used as the area of the sub-pixel 122 (e.g., 122G, 122B or 122R).

When the light emitting panel 100 takes Pixels Per Inch (PPI) as a unit, the resolution X is between 30 and 600, and the size Y is between 2 micrometers and 80 micrometers, and the shape of the light guide unit 152 is not limited. Through regression analysis, the number N can be obtained to satisfy the following equation:

$$(25540(X^*Y)^\wedge - 1) + (173600000(X^*Y)^\wedge - 2) - (0.000749(X^*Y)^\wedge - 3) +$$
$$(0.079(X^*Y)^\wedge - 4) - (2.548(X^*Y)^\wedge - 5) - 0.1085 \leq N \leq$$
$$(44027(X^*Y)^\wedge - 1) + (430300000(X^*Y)^\wedge - 2) - (0.005148(X^*Y)^\wedge - 3) +$$
$$(0.5005(X^*Y)^\wedge - 4) - (15.6(X^*Y)^\wedge - 5) - 0.00081967$$

Wherein, X*Y represents X multiplied by Y, X is the resolution of the light emitting panel 100 in pixels per inch, and Y is the size of a single light-guiding unit 152 in micrometers. If the light-guiding 152 is a polygon, the above-mentioned number N can be corrected by the following equation:

$$(23707(X^*Y)^\wedge - 1) + (231700000(X^*Y)^\wedge - 2) - (0.00277(X^*Y)^\wedge - 3) +$$
$$(0.2695(X^*Y)^\wedge - 4) - (8.4(X^*Y)^\wedge - 5) - 0.000441361 \leq N \leq$$
$$(44027(X^*Y)^\wedge - 1) + (430300000(X^*Y)^\wedge - 2) - (0.005148(X^*Y)^\wedge - 3) +$$
$$(0.5005(X^*Y)^\wedge - 4) - (15.6(X^*Y)^\wedge - 5) - 0.00081967$$

Alternatively, if the light-guiding unit 152 has a curved profile, the above number N can be corrected by the following equation:

$$(25540(X^*Y)^\wedge - 1) + (173600000(X^*Y)^\wedge - 2) - (0.000749(X^*Y)^\wedge - 3) +$$
$$(0.0791(X^*Y)^\wedge - 4) - (2.548(X^*Y)^\wedge - 5) - 0.1085 \leq N \leq$$
$$(47432(X^*Y)^\wedge - 1) + (322400000(X^*Y)^\wedge - 2) - (0.001391(X^*Y)^\wedge - 3) +$$
$$(0.1469(X^*Y)^\wedge - 4) - (4.732(X^*Y)^\wedge - 5) - 0.2015$$

Figure 6A:
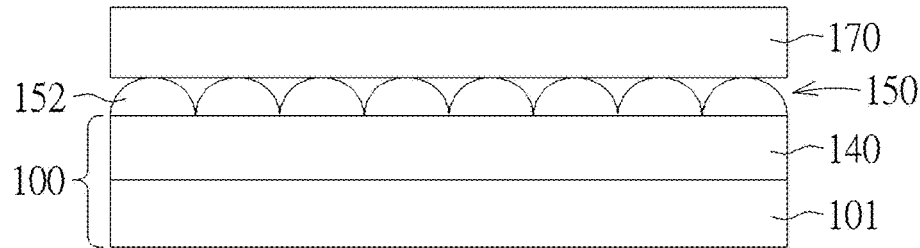
FIGS. 6A to 6C are used to illustrate several arrangements of a single substrate, a light-emitting structure layer, a light guiding structure and a light conversion structure of other light emitting devices of the present disclosure.
Figure 6B:
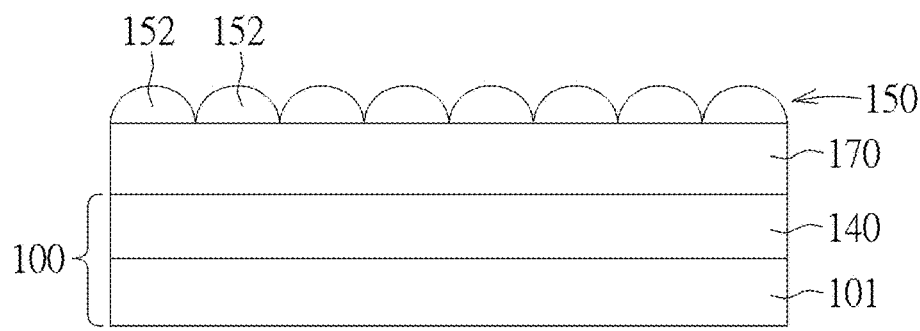
Figure 6C:
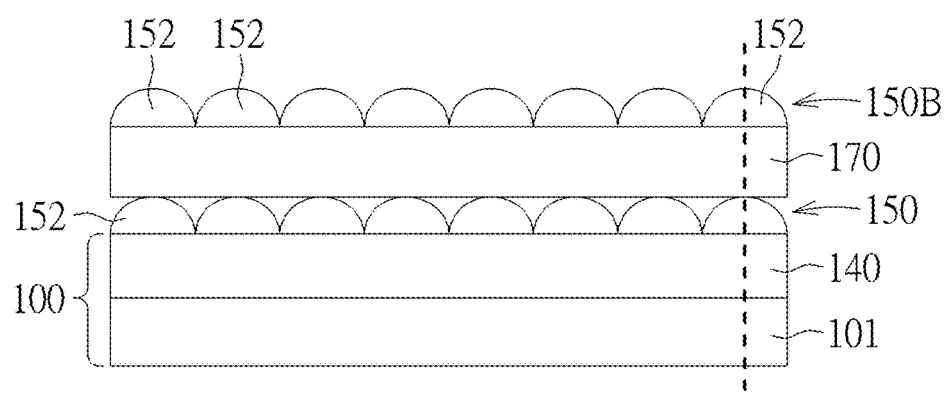

Referring to FIGS. 6A to 6C, FIGS. 6A to 6C are simplified schematic cross-sectional views of other light emitting devices of the present disclosure, which are mainly used to illustrate different arrangements of the substrate 101, light-emitting structure layer 140, light guiding structure 150, and light-converting structure 170 of the light emitting device of the present disclosure. The light emitting device in FIGS. 6A to 6C does not include the substrate 102 in FIG. 1. In the example of FIG. 6A, the light guiding structure 150 is disposed between the light emitting structure layer 140 and the light converting structure 170. In the example of FIG. 6B, the light guiding structure 150 is disposed on the light converting structure 170. In the example shown in FIG. 6C, the light emitting device includes multiple groups of light guiding structures. For example, the light guiding structure 150 is disposed between the light-emitting structure layer 140 and the light-converting structure 170, and another light guiding structure 150B is disposed on the light-converting structure 170.

Figure 7A:
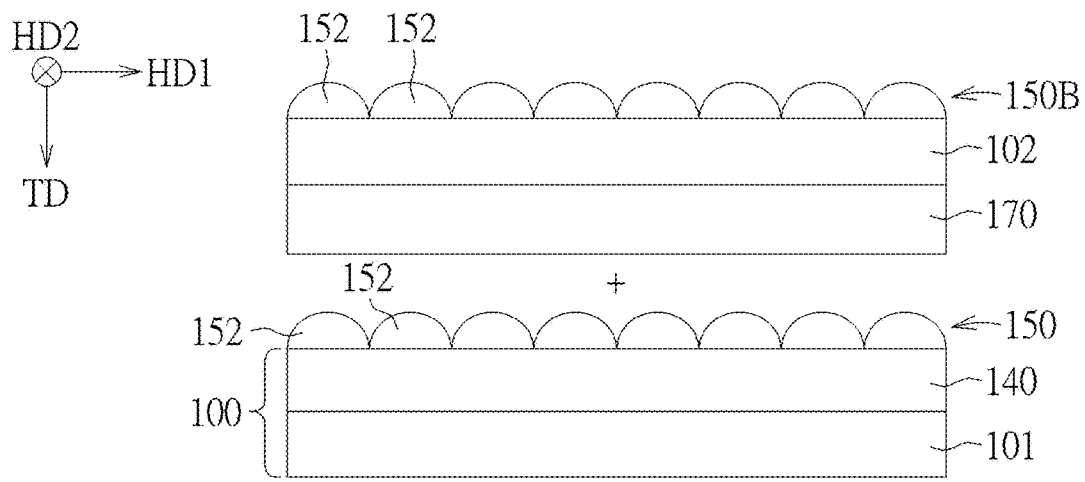
FIG. 7A to FIG. 7C illustrate several arrangements of two substrates, a light-emitting structure layer, a light guiding structure and a light-conversion structure of other light emitting devices of the present disclosure.
Figure 7B:
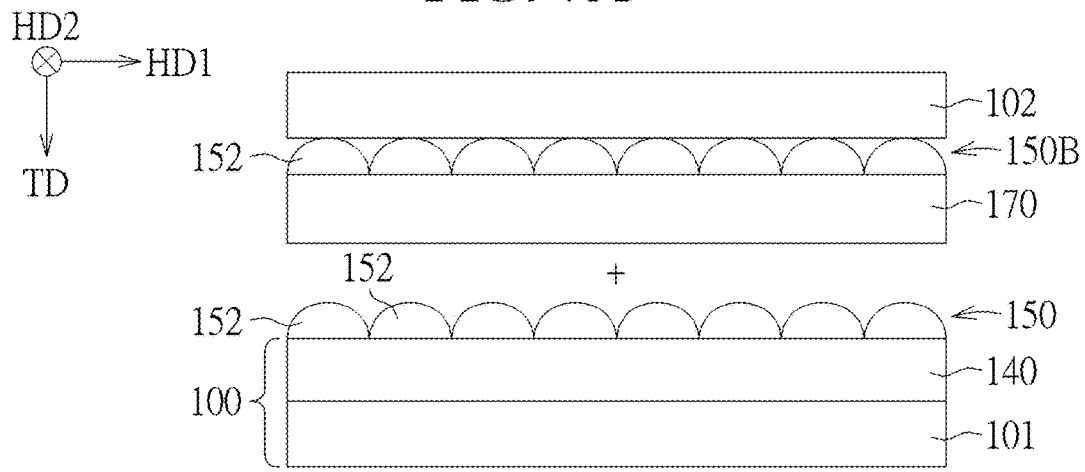
Figure 7C:
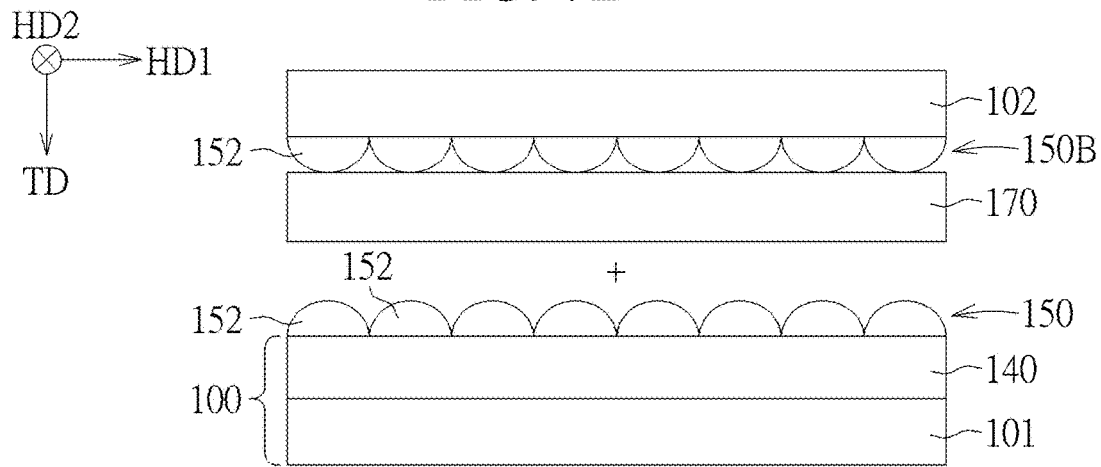

Please refer to FIG. 7A to FIG. 7C. FIG. 7A to FIG. 7C are simplified schematic cross-sectional views of other light emitting devices of the present disclosure, which are mainly used to illustrate different arrangements of the substrate 101, the light-emitting structure layer 140, the light guiding structure 150, the light conversion structure 170 and the substrate 102 of other light emitting devices of the present disclosure. The light emitting device in FIGS. 7A to 7C comprises the substrate 102 in FIG. 1. In the example of FIG. 7A, the light guiding structure 150 is disposed between the light emitting structure layer 140 and the light conversion structure 170, and another light guiding structure 150B is disposed on the substrate 102. In the example of FIG. 7B, the light guiding structure 150 is disposed between the light emitting structure layer 140 and the light converting structure 170, and another light guiding structure 150B is disposed between the light converting structure 170 and the substrate 102. In the example of FIG. 7C, the relative positions of the substrate 101, the light emitting structure layer 140, the light guiding structure 150, the light conversion structure 170, and the substrate 102 are the same as those in FIG. 7B, and the difference is that the setting of the top surface and bottom surface of the light-guiding unit 152 of the light guiding structure 150B in FIG. 7C is different from that in FIG. 7B. In FIG. 7B, the convex surfaces of the light-guiding unit 152 of the light guiding structure 150 and the light guiding structure 150B face the same direction. In FIG. 7C, the convex surfaces of the light-guiding unit 152 of the light guiding structure 150 faces in a direction opposite to the direction of the convex surfaces of the light-guiding unit 152 of the light guiding structure 150B.

Figure 8:
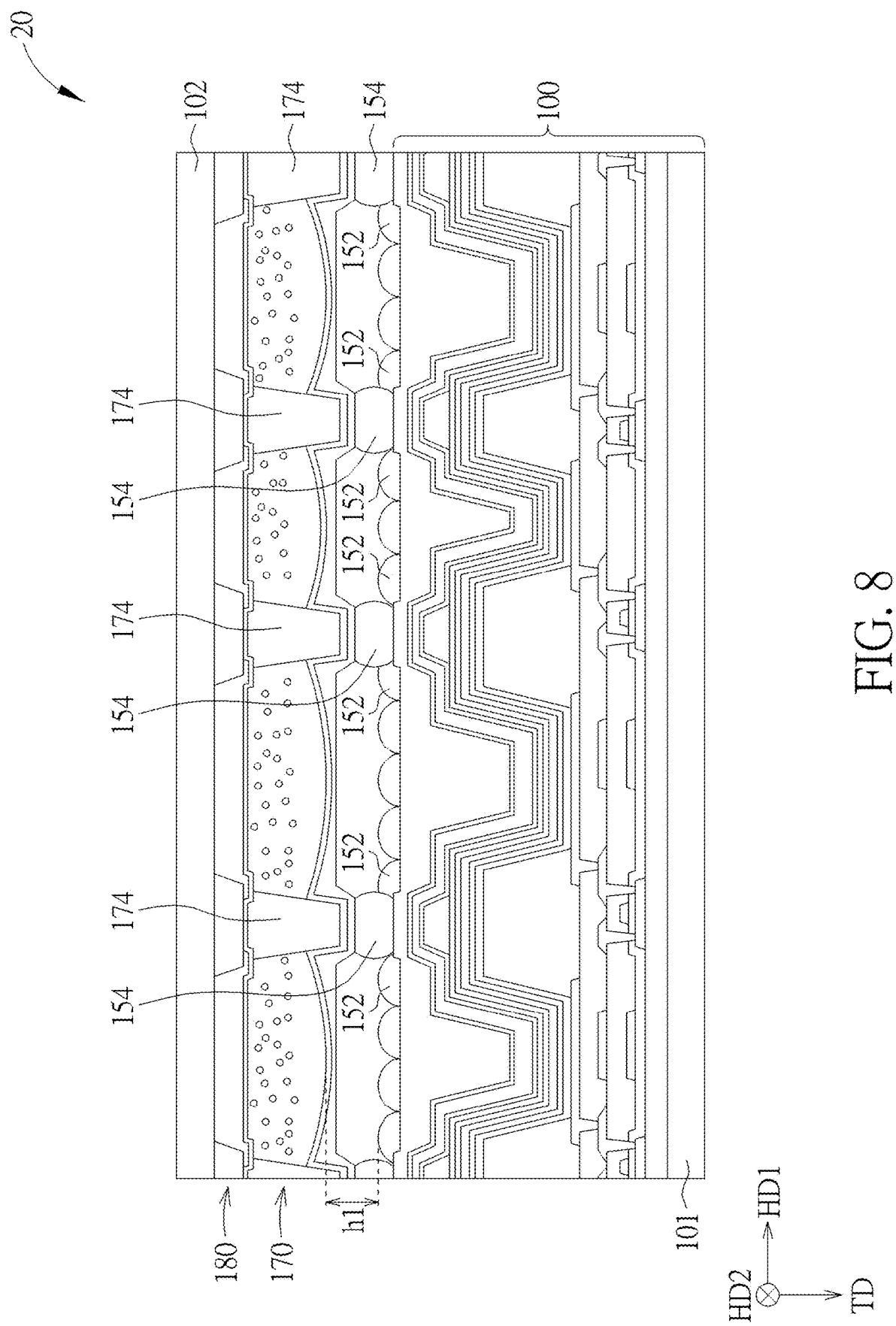
FIG. 8 to FIG. 12 are cross-sectional diagrams of the light emitting devices with two substrates according to different embodiments of the present disclosure.

Referring to FIG. 8, FIG. 8 shows a schematic cross-sectional view of a light emitting device 20 of another embodiment. The difference between the light emitting device 20 and the light emitting device 10 of FIG. 1 is that the light emitting device 20 has a post spacer (PS) 154, which is set under the shading structure 174, and the light-guiding unit 152 and the post spacer 154 can form an interference to reduce the risk of displacement of the post spacer 154 due to external forces. Since the spacing h1 between the light conversion structure 170 and the light-guiding unit 152 is increased, the light entering the light conversion structure 170 from the light emitting panel 100 will be more evenly distributed.

Figure 9:
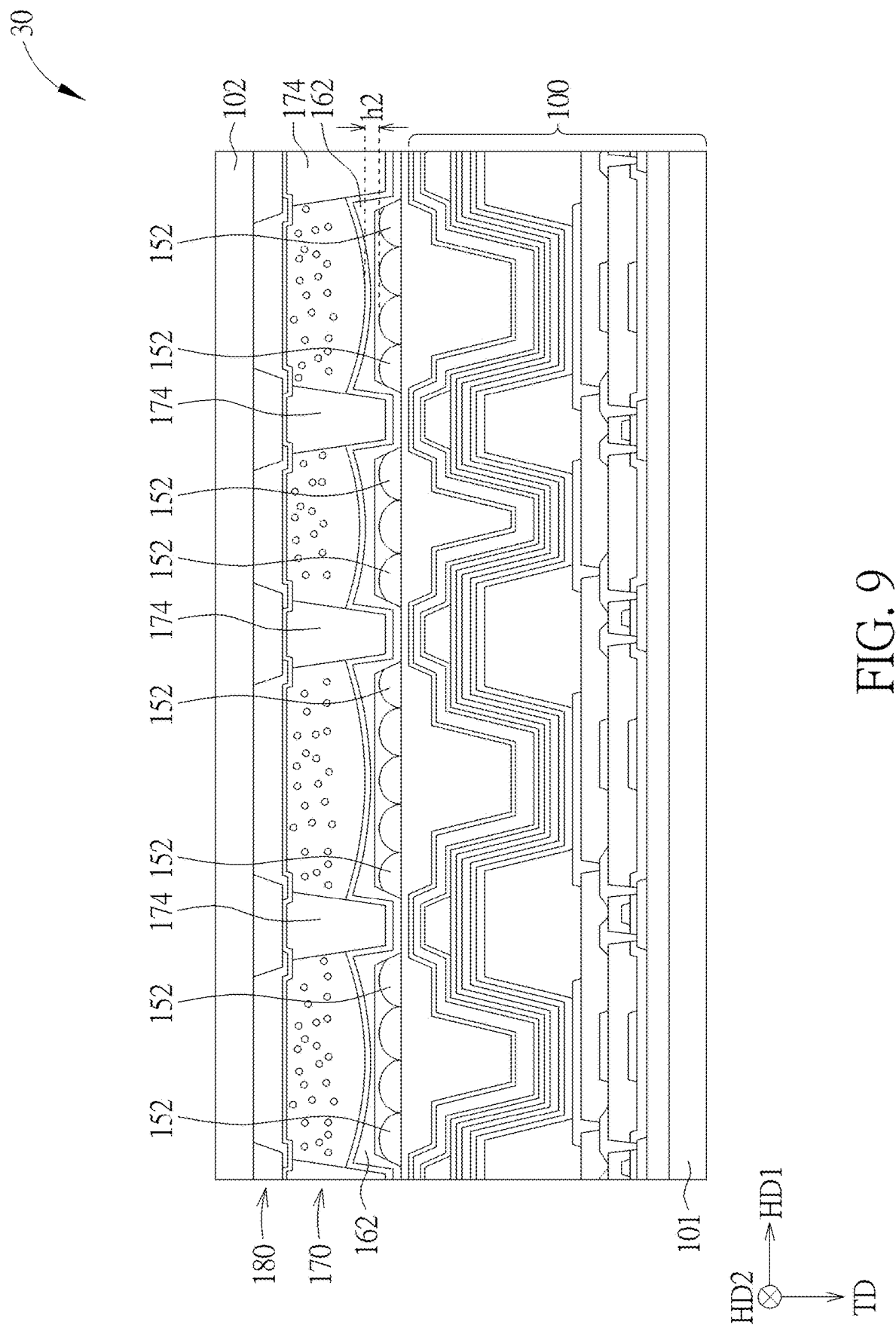

Referring to FIG. 9, FIG. 9 shows a schematic cross-sectional view of a light emitting device 30 of another embodiment. The difference between the light emitting device 30 and the light emitting device 10 of FIG. 1 is that the light-guiding unit 152 of the light emitting device 30 can interfere with the light blocking structure 174. Since the spacing h2 between the light conversion structure 170 and the light-guiding unit 152 is reduced, the amount of light input to the light conversion structure 170 can be increased.

Figure 10:
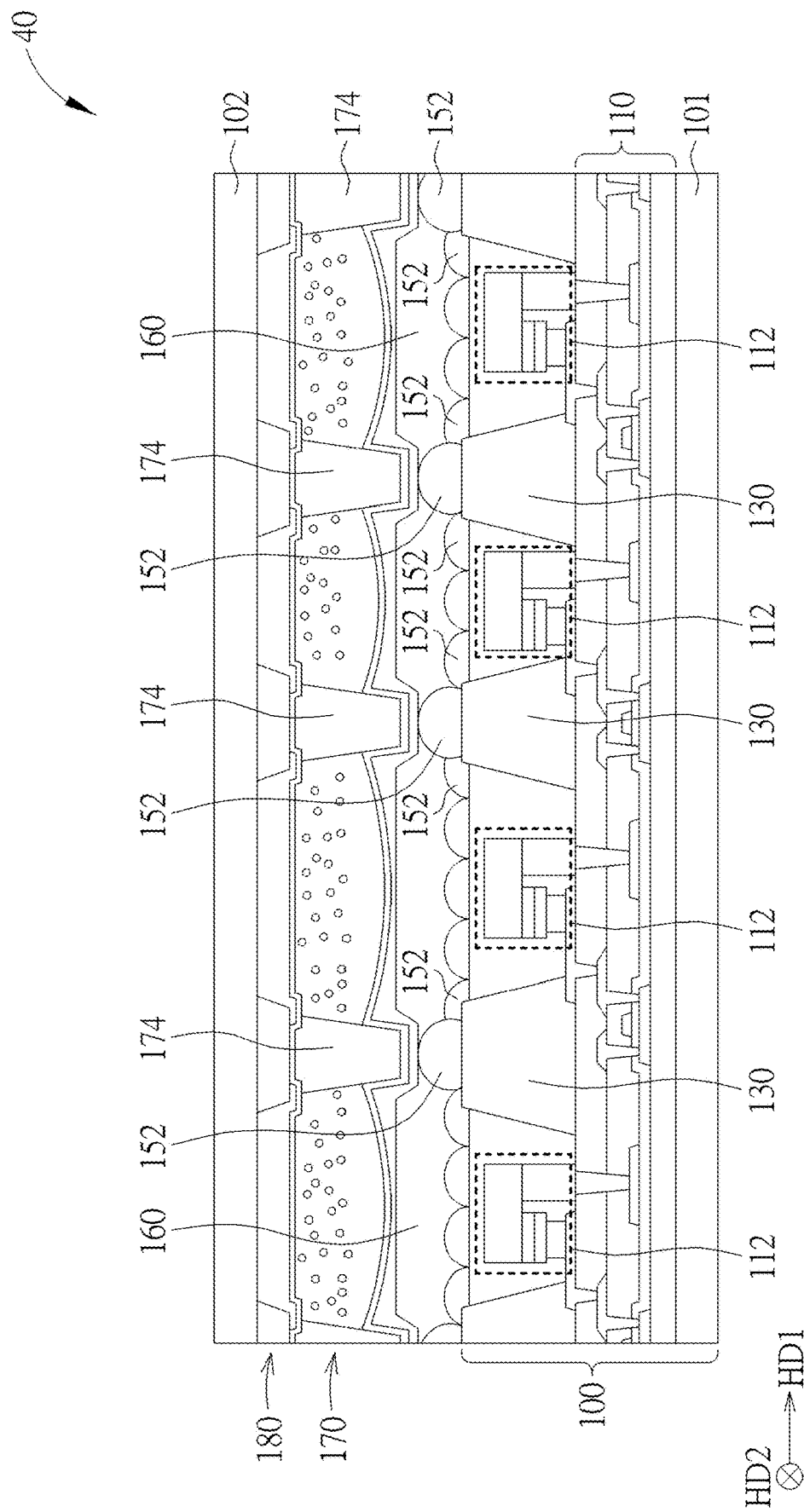

Referring to FIG. 10, FIG. 10 is a schematic cross-sectional view of a light emitting device 40 according to another embodiment of the present disclosure. The difference between the light emitting device 40 and the light emitting device 20 in FIG. 8 is that part of the light-guiding unit 152 of the light emitting device 40 can be used as a columnar spacer, thereby saving the manufacturing process of the columnar spacer 154. In addition, the light-emitting unit 112 of the light emitting device 40 can be an F-type micro-LED, but is not limited thereto.

Figure 11:
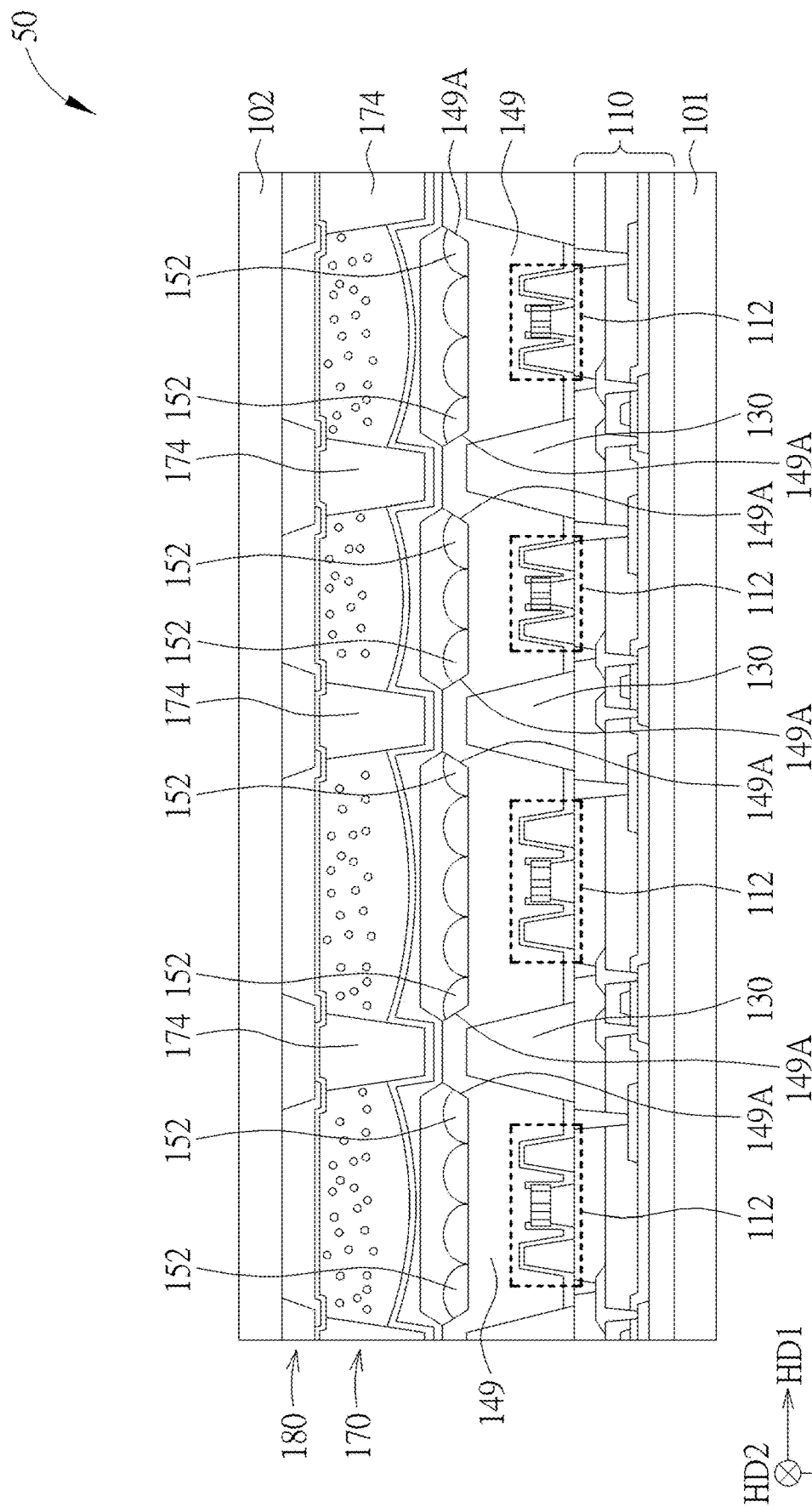

Referring to FIG. 11, FIG. 11 is a schematic cross-sectional view of a light emitting device 50 according to another embodiment of the present disclosure. The difference between the light emitting device 50 and the light emitting device 10 in FIG. 1 is that part of the light-guiding unit 152 of the light emitting device 50 can extend to the slope 149A of the protective layer 149, so as to increase the amount of side light entering. In addition, the light-emitting unit 112 of the light emitting device 50 may be a bar type LED, but not limited thereto.

Figure 12:
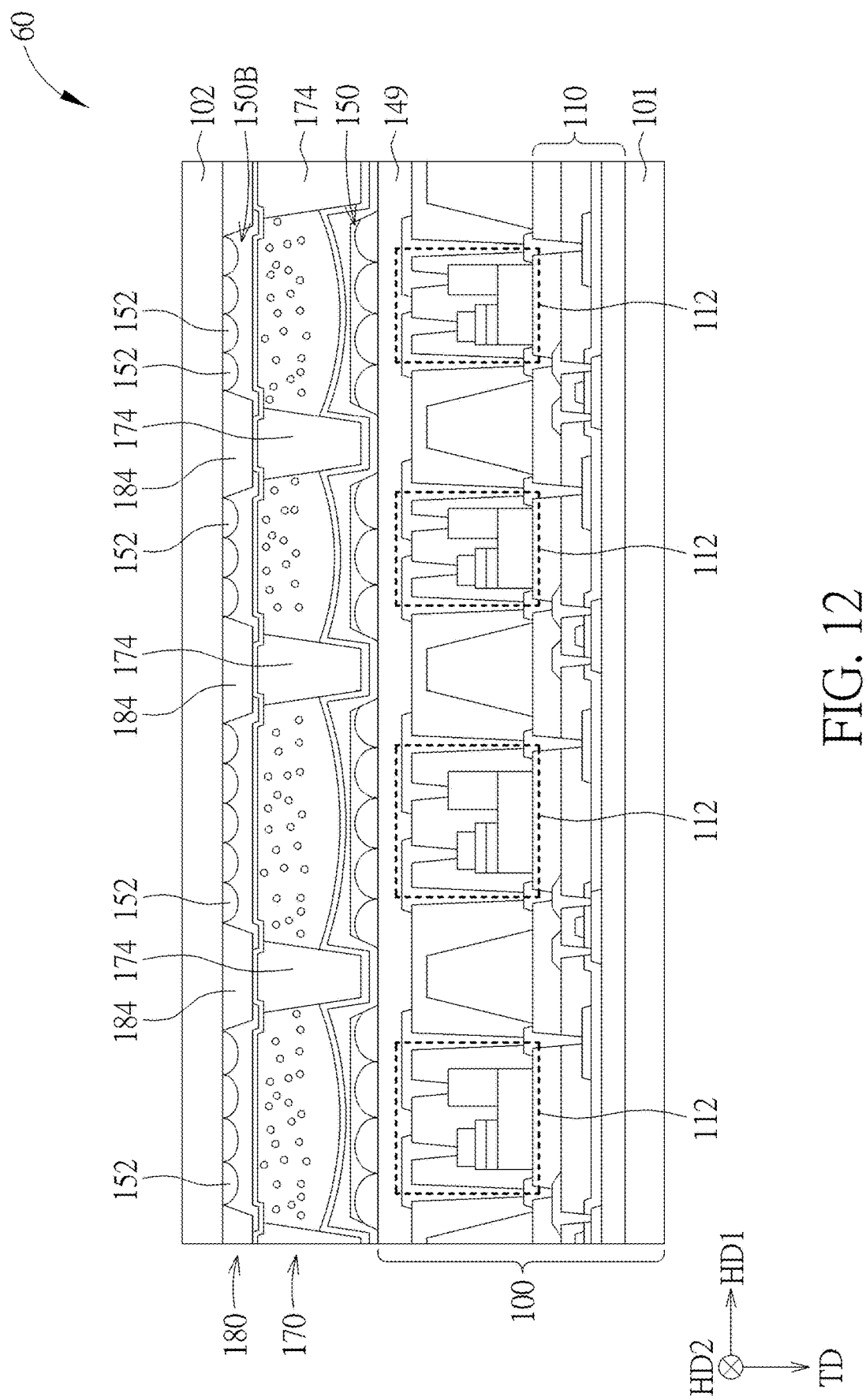

Referring to FIG. 12, FIG. 12 is a schematic cross-sectional view of a light emitting device 60 according to another embodiment of the present disclosure. The difference between the light emitting device 60 and the light emitting device 10 in FIG. 1 is that the light emitting device 60 further comprises a light guiding structure 150B, which is arranged between the substrate 102 and the filter structure 180, so as to improve the light extraction efficiency of the light-emitting structure 200 and increase the light emission. In addition, the light-emitting unit 112 of the light emitting device 60 may be a V-type micro-LED, but is not limited thereto.

Figure 13A:
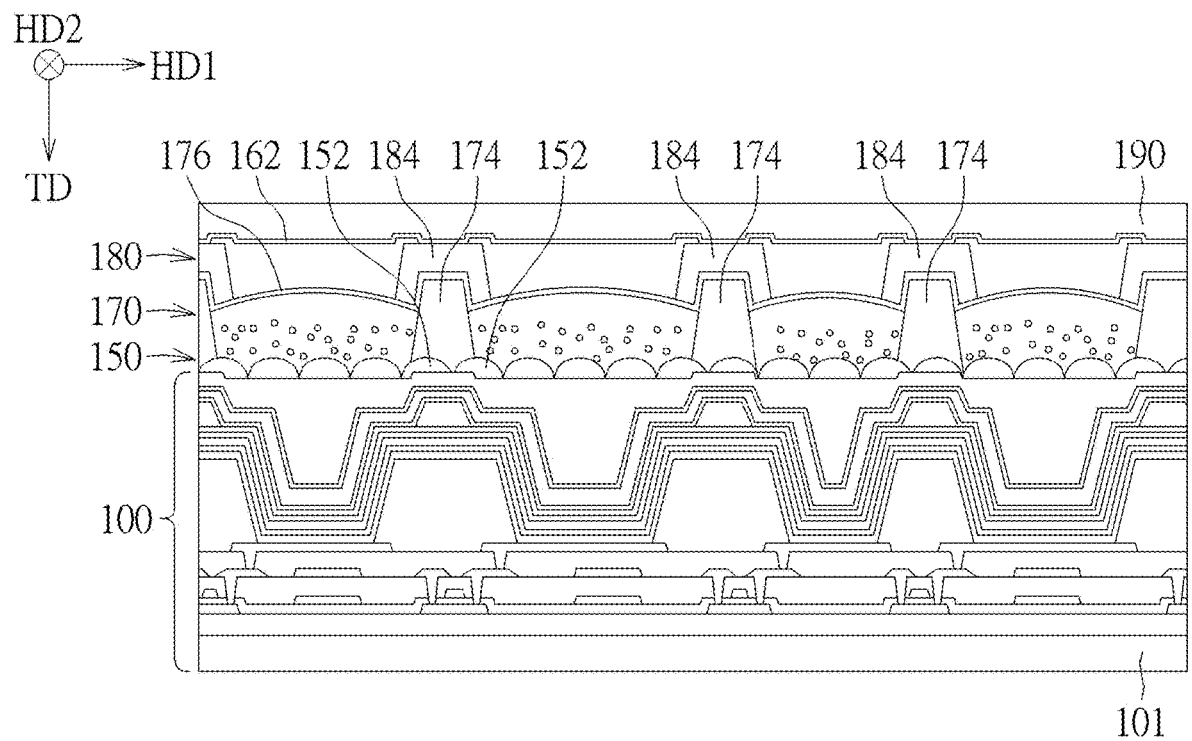
FIG. 13A to FIG. 13D are used to illustrate the different structures of the light emitting device with a single substrate of the present disclosure.
Figure 13B:
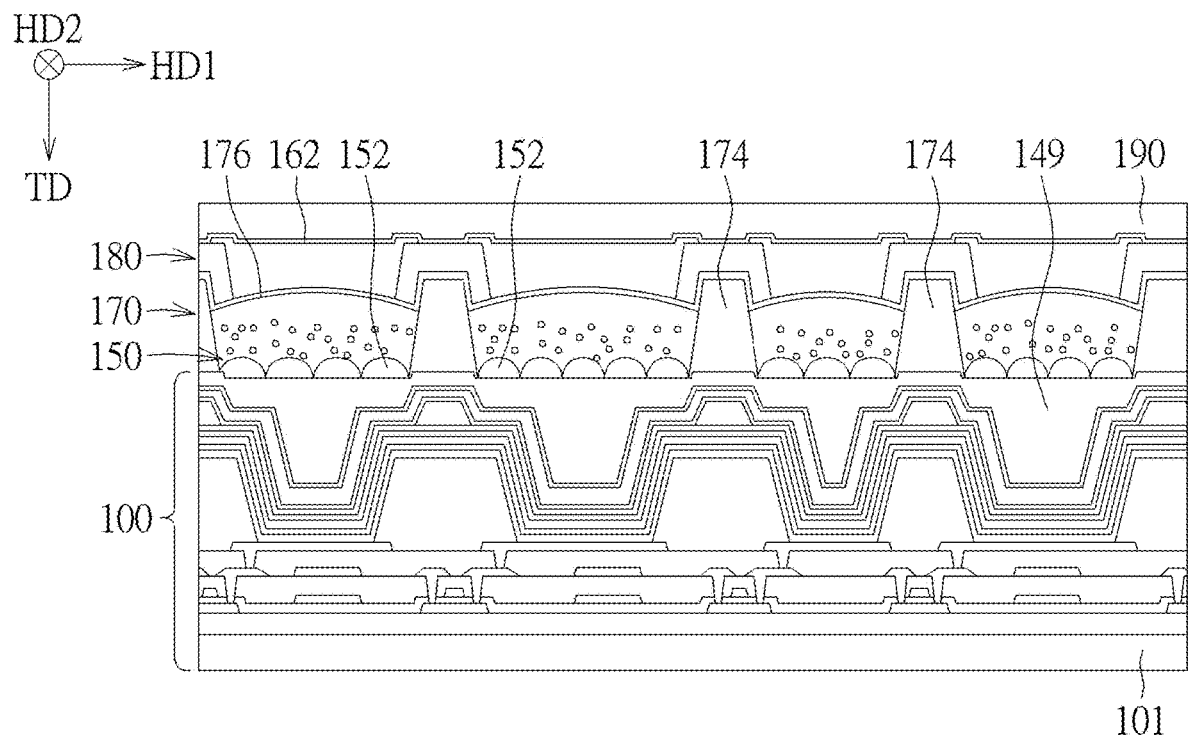
Figure 13C:
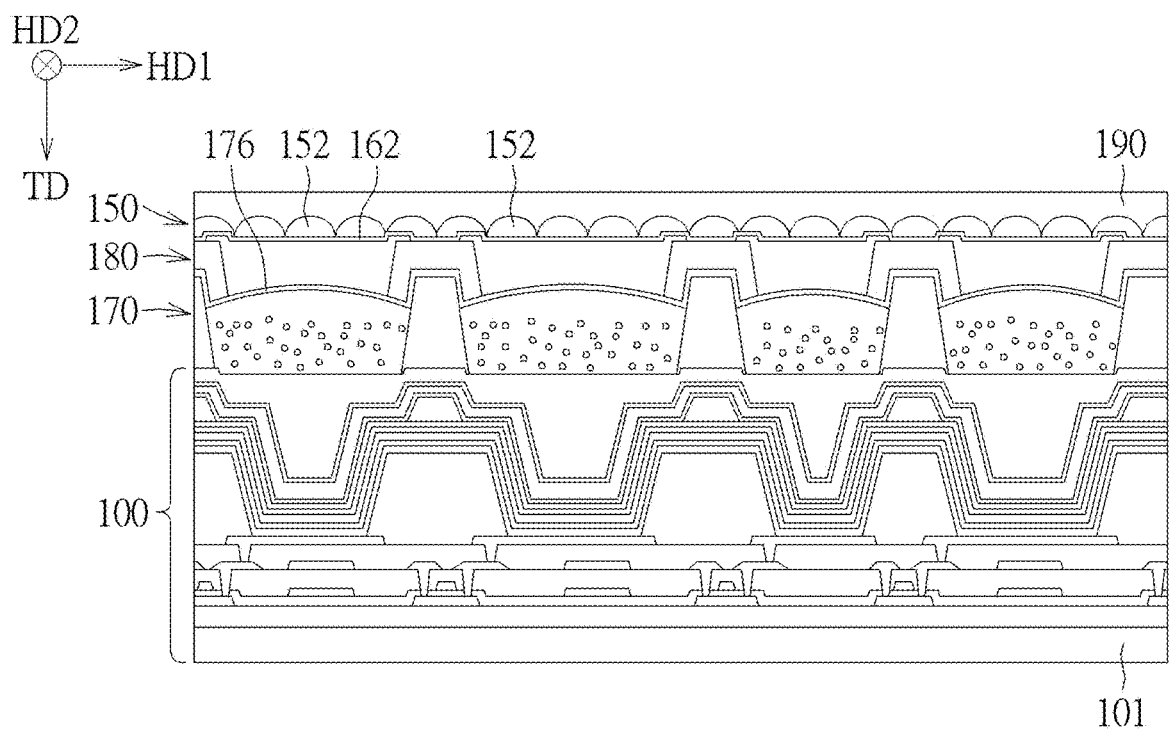
Figure 13D:
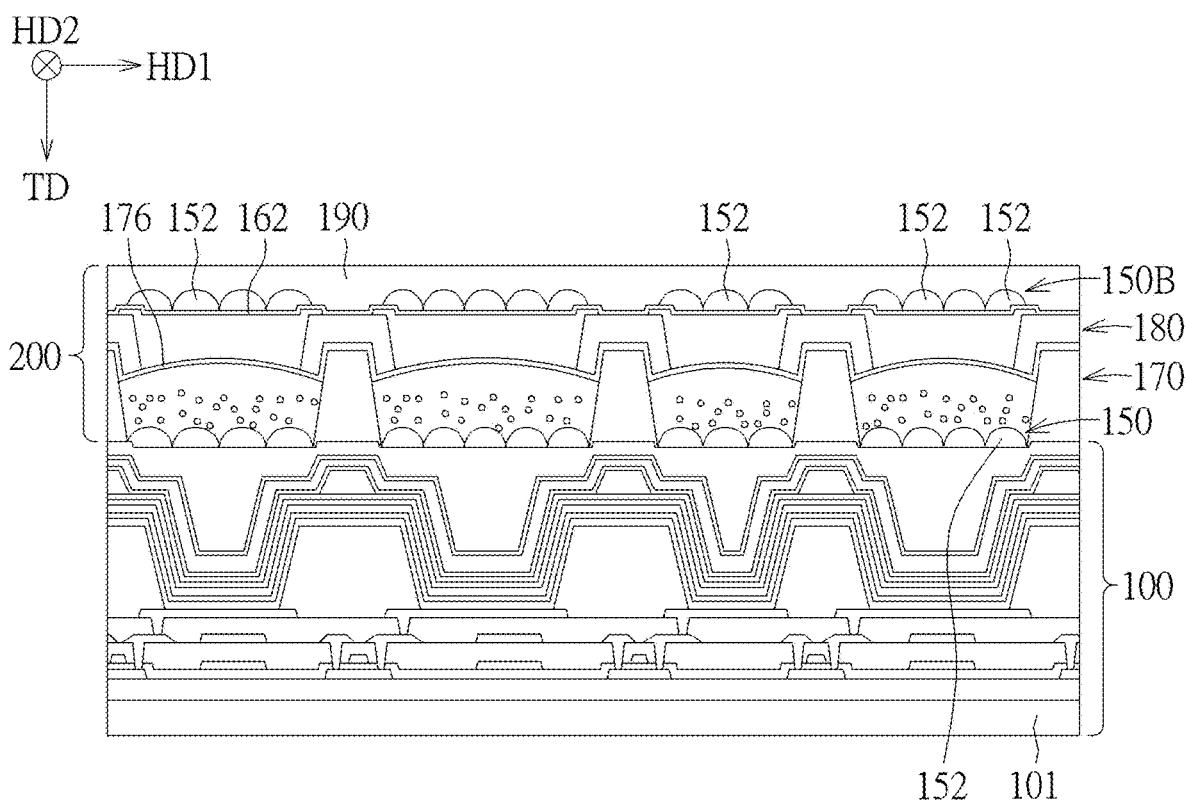

Referring to FIGS. 13A to 13D, FIGS. 13A to 13D are used to illustrate different structures of the light emitting device having a substrate 101 but not a substrate 102 as disclosed herein. In the embodiment of FIG. 13A, the shading structure 174 is in contact with the light-guiding unit 152, and the rough of the light-guiding unit 152 strengthens the solid force of the shading structure 174. In the embodiment of FIG. 13B, the shading structure 174 is set on the area with a flat surface in the protective layer 149, and the skewing of the shading structure 174 caused by the stacking of multiple layers of structures can be reduced. In the embodiment of FIG. 13C, the light guiding structure 150 is set on the filter structure 180 to reduce water, oxygen or ions from entering the filter structure 180. In the embodiment of FIG. 13D, another light guiding structure 150B is set on the filter structure 180 to improve the light extraction efficiency of the light-emitting structure 200 and increase the brightness of the light emitting device.

Figure 14:
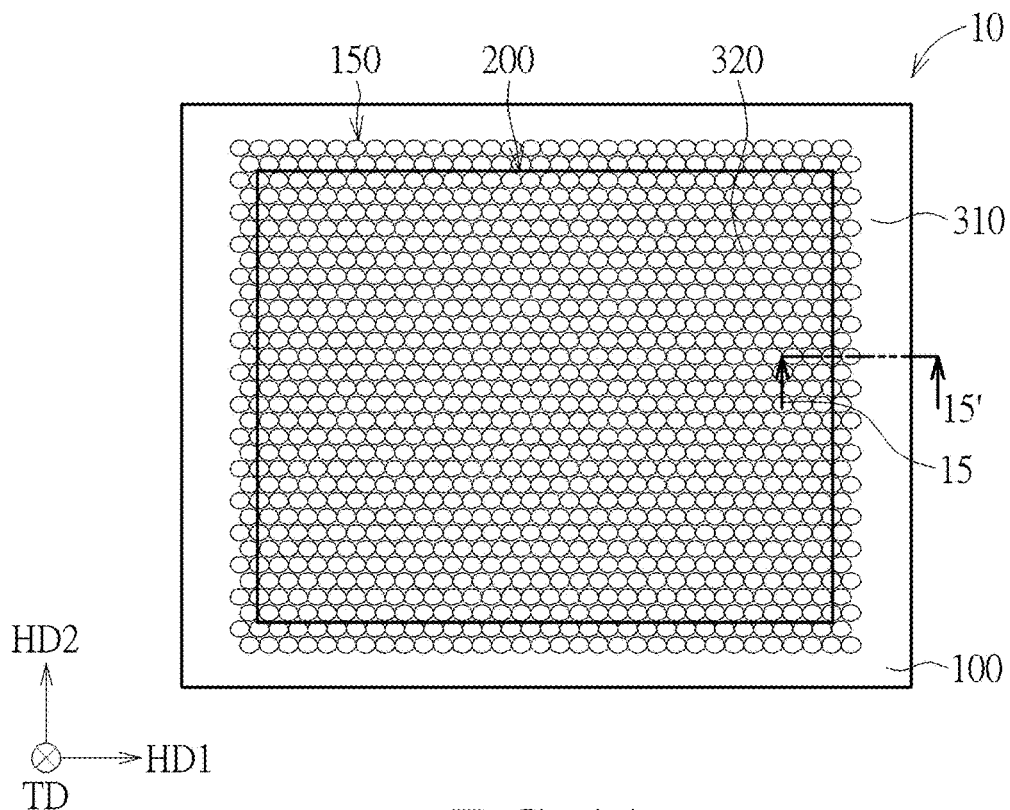
FIG. 14 shows another top view of the light emitting device of FIG. 1.
Figure 15:
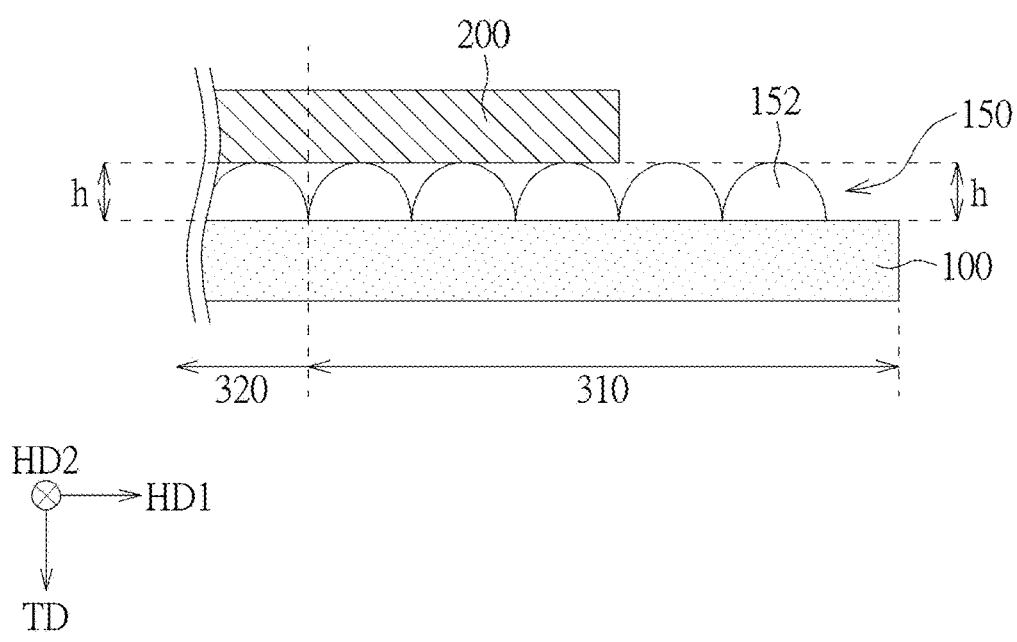
FIG. 15 is a cross-sectional view of the light emitting device of FIG. 14 along a dotted line 15-15'.

Referring to FIG. 14 and FIG. 15, FIG. 14 is another top view of the light emitting device 10 of FIG. 1, and FIG. 15 is a cross-sectional view of the light emitting device 10 of FIG. 14 along a dotted line 15-15'. The light-emitting structure 200 and the light guiding structure 150 both fully cover the display area 320 of the light emitting panel 100, and the light-emitting structure 200 and the light guiding structure 150 partially cover the non-display area 310 of the light emitting panel 100. After the light-emitting structure 200 is attached to the light guiding structure 150 and the light emitting panel 100, the spacing h between the light-emitting structure 200 and the light emitting panel 100 is approximately equal to the maximum thickness of the light guide structure 150. The layout area of the light-emitting structure 200 is smaller than the layout area of the light guiding structure 150, so when the light-emitting structure 200 is bonded to the light guide structure 150 and the light emitting panel 100, since the light-emitting structure 200 is supported by the light guiding structure 150, the probability of cracking or breaking of the light-emitting structure 200 due to alignment deviation during lamination could be reduced.

The light emitting device of the present disclosure optimizes the number of light-guiding units corresponding to the sub-pixels, so that the light extraction efficiency of the light emitting device can be improved and the brightness of the light emitting device can be increased.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emitting device, comprising:
    a light emitting panel comprising a pixel, the pixel comprising a first sub-pixel and a second sub-pixel, wherein in a top view of the light emitting device, an area of the first sub-pixel is greater than an area of the second sub-pixel;
    a light guiding structure disposed on the light emitting panel and comprising:
        a first amount of light guiding units overlapping with the first sub-pixel; and
        a second amount of light guiding units overlapping with the second sub-pixel, wherein the first amount is greater than the second amount; and
    a filter structure disposed on the light guiding structure and comprising:
        a first filter unit overlapping with the first sub-pixel; and
        a second filter unit overlapping with the second sub-pixel.

2. The light emitting device as claimed in claim 1, wherein in the top view of the light emitting device, an area of the first filter unit is greater than an area of the second filter unit.

3. The light emitting device as claimed in claim 1, wherein a color of the first filter unit is green.

4. The light emitting device as claimed in claim 1, wherein a color of the second filter unit is blue.

5. A light emitting device, comprising:
    a light emitting panel comprising a pixel, the pixel comprising a first sub-pixel and a second sub-pixel, wherein in a top view of the light emitting device, an area of the first sub-pixel is greater than an area of the second sub-pixel; and
    a light guiding structure disposed on the light emitting panel and comprising:
        a first amount of light guiding units overlapping with the first sub-pixel; and
        a second amount of light guiding units overlapping with the second sub-pixel, wherein the first amount is greater than the second amount;
    wherein the first amount satisfies the following equation:

$$25540(X*Y)^{-1}+173600000(X*Y)^{-2}-0.000749(X*Y)^{-3}+0.0791(X*Y)^{-4}-2.548(X*Y)^{-5}-0.1085 \leq N \leq 44027(X*Y)^{-1}+430300000(X*Y)^{-2}-0.005148(X*Y)^{-3}+0.5005(X*Y)^{-4}-15.6(X*Y)^{-5}-0.00081967;$$

wherein X is a resolution of the light emitting panel in PPI, Y is a size of one of the plurality of light guiding units in micrometer, and N is the first amount.

* * * * *